(12) United States Patent
Hunter et al.

(10) Patent No.: US 7,083,895 B2
(45) Date of Patent: Aug. 1, 2006

(54) ADHESION PROMOTING INGREDIENTS FOR ON-PRESS DEVELOPABLE LITHOGRAPHIC PRINTING PLATE PRECURSORS

(75) Inventors: Joseph Hunter, Fort Collins, CO (US); Eric Clark, Loveland, CO (US); James Mulligan, Fort Collins, CO (US); Saraiya Shashikant, Fort Collins, CO (US); Jianbing Huang, Trumbull, CT (US)

(73) Assignee: Kodak Polychrome Graphics LLC, Norwalk, CT (US)

( * ) Notice: Subject to any disclaimer, the term of this patent is extended or adjusted under 35 U.S.C. 154(b) by 0 days.

(21) Appl. No.: 10/931,328

(22) Filed: Sep. 1, 2004

(65) Prior Publication Data

US 2006/0046196 A1    Mar. 2, 2006

(51) Int. Cl.
*G03F 7/038* (2006.01)
*G03F 7/039* (2006.01)
*G03F 7/11* (2006.01)
*G03F 7/30* (2006.01)

(52) U.S. Cl. .............. 430/276.1; 430/271.1; 430/278.1; 430/302; 430/330; 430/910; 430/964

(58) Field of Classification Search ............. 430/271.1, 430/276.1, 278.1, 910, 302, 330, 964
See application file for complete search history.

(56) References Cited

U.S. PATENT DOCUMENTS

| | | | | |
|---|---|---|---|---|
| 4,427,766 | A | * | 1/1984 | Mohr ................... 430/525 |
| 6,582,882 | B1 | * | 6/2003 | Pappas et al. ......... 430/271.1 |
| 2003/0064318 | A1 | | 4/2003 | Huang et al. |
| 2004/0260050 | A1 | * | 12/2004 | Munnelly et al. ......... 528/176 |

OTHER PUBLICATIONS

DuPont™TYZOR® Organic Titanates—General Brochure, Copyright 2001, E.I. du Pont de Nemours and Company, Wilmington, DE.

* cited by examiner

*Primary Examiner*—Richard L. Schilling
(74) *Attorney, Agent, or Firm*—J. Lanny Tucker

(57) ABSTRACT

Imageable elements, useful as on press developable lithographic printing plate precursors, are disclosed. The elements comprise an imageable layer over a substrate and an one or more adhesion promoting ingredients. The imageable layer comprises a polymerizable compound and a polymeric binder. The adhesion promoting ingredients are titanium chelate and/or co-polymers of a monomer having a polethylene oxide side chain with a monomer having either an acidic group or an anhydride group that has been ring opened to form an acidic group or groups.

32 Claims, No Drawings

ADHESION PROMOTING INGREDIENTS FOR ON-PRESS DEVELOPABLE LITHOGRAPHIC PRINTING PLATE PRECURSORS

FIELD OF THE INVENTION

The invention relates to lithographic printing. In particular, this invention relates to imageable elements, useful as on press developable lithographic printing plate precursors, in which the imageable element comprises an adhesion promoting ingredient.

BACKGROUND OF THE INVENTION

In conventional or "wet" lithographic printing, ink receptive regions, known as image areas, are generated on a hydrophilic surface. When the surface is moistened with water and ink is applied, the hydrophilic regions retain the water and repel the ink, and the ink receptive regions accept the ink and repel the water. The ink is transferred to the surface of a material upon which the image is to be reproduced. Typically, the ink is first transferred to an intermediate blanket, which in turn transfers the ink to the surface of the material upon which the image is to be reproduced.

Imageable elements useful as lithographic printing plate precursors typically comprise an imageable layer applied over the hydrophilic surface of a substrate. The imageable layer includes one or more radiation-sensitive components, which may be dispersed in a suitable binder. Alternatively, the radiation-sensitive component can also be the binder material. Following imaging, either the imaged regions or the unimaged regions of the imageable layer are removed by a suitable developer, revealing the underlying hydrophilic surface of the substrate. If the imaged regions are removed, the precursor is positive-working. Conversely, if the unimaged regions are removed, the precursor is negative-working. In each instance, the regions of the imageable layer (i.e., the image areas) that remain are ink-receptive, and the regions of the hydrophilic surface revealed by the developing process accept water and aqueous solutions, typically a fountain solution, and repel ink.

Conventional imaging of the imageable element with ultraviolet and/or visible radiation was carried out through a mask, which has clear and opaque regions. Imaging takes place in the regions under the clear regions of the mask but does not occur in the regions under the opaque regions. However, direct digital imaging, which obviates the need for imaging through a mask, is becoming increasingly important in the printing industry. Imageable elements for the preparation of lithographic printing plates have been developed for use with infrared lasers.

Imaged imageable elements typically require processing in a developer to convert them to lithographic printing plates. Developers are often aqueous alkaline solutions, which may also contain substantial amounts of organic solvents. Because of their high pH and the presence of organic solvents, disposal of substantial quantities of used developer is expensive and can cause environmental problems. Processing of the imaged imageable element in a developer also introduces additional costs in, for example, the cost of the developer, the cost of the processing equipment, and the cost of operating the process.

On-press developable lithographic printing plate precursors can be directly mounted on a press after imaging and developed with ink and/or fountain solution during the initial press operation. These precursors do not require a separate development step before mounting on press and, thus, avoid the cost of the developer and the problems associated with its disposal. On press imaging, in which the precursor is both imaged and developed on press, eliminates mounting the precursor in a separate imaging device.

On press developable imageable elements are disclosed in Patent Publication US 2003/0064318 A1, the disclosure of which is incorporated herein by reference. However, the imageable layer of these imageable elements sometimes has poor adhesion to the substrate. This produces short run lengths on many types of grained and anodized substrates, severely limits the choice of substrate, and limits the maximum achievable run length. Thus, a need exists for a method for increasing the adhesion of the imageable layer to the substrate in these imageable elements.

SUMMARY OF THE INVENTION

The invention is an imageable element in which the imageable layer has increased adhesion to the substrate. The imageable element comprises:

(a) a substrate comprising a support; and
(b) an imageable layer over the substrate;

in which:

the support is aluminum or an aluminum alloy;

the imageable layer comprises a polymerizable compound and a polymeric binder;

the polymeric binder comprises K units and L units, and the imageable element comprises one or more adhesion promoting ingredients selected from the group consisting of:

i) titanium chelates;
ii) co-polymers that comprise L units and M units; and
iii) mixtures thereof;

the K units are selected from $-[CH_2C(R^1)R^2]-$, $-[CH_2CR^1(CO_2R^3)]-$, $-[CH_2CR^1(CONR^3_2)]-$, $-[CH(CONR^6CO)CH]-$, and mixtures thereof;

the L units are $-[CH_2C(R^1)(CO_2(CH_2CH_2O)_nT)]-$;

the M units are $-[CH(R^4)CH(CO_2H)]-$;

each $R^1$ is independently hydrogen, methyl, or a mixture thereof;

$R^2$ is hydrogen, methyl, phenyl, substituted phenyl, halogen, cyano, alkoxy of one to four carbon atoms, acyl of one to five carbon atoms, acyloxy of one to five carbon atoms, allyl, or a mixture thereof;

$R^3$ is alkyl of one to six carbon atoms, phenyl, or a mixture thereof;

$R^4$ is hydrogen, methyl, $-CO_2H$, $-CO_2R^5$, or a mixture thereof;

$R^5$ is an alkyl group of one to six carbon atoms or a mixture of alkyl groups of one to six carbon atoms;

$R^6$ is hydrogen, hydroxyl, phenyl, substituted phenyl, alkyl of one to six carbon atoms, cyclohexyl, benzyl, or a mixture thereof;

n is about 5 to about 400; and

T is hydrogen, alkyl of one to eight carbon atoms, phenyl, or a mixture thereof.

The adhesion promoting ingredient may be in the imageable layer, or it may be in a separate layer between the imageable layer and the substrate, or it may be in both the imageable layer and in a separate layer. More than one adhesion promoting ingredient may be used, and one adhesion promoting ingredient may be in the imageable layer while another adhesion promoting ingredient is in the separate layer between the imageable layer and the substrate.

In another aspect, the invention is a method for forming an image by thermally imaging the imageable element and developing the resulting imageable element with ink and fountain solution.

DETAILED DESCRIPTION OF THE INVENTION

Unless the context indicates otherwise, in the specification and claims, the terms polymeric binder, co-binder, free radical generator, co-polymer, polymerizable compound, adhesion promoting ingredient, titanium chelate, and similar terms include mixtures of such materials. Unless otherwise indicated, all percentages are percentages by weight (wt %) and all temperatures are in degrees Centigrade (degrees Celsius).

Imageable Elements

Substrate

The substrate comprises a support, which is either aluminum or an aluminum alloy. The surface of the support may be treated by techniques known in the art, including physical graining, electrochemical graining, chemical graining, and anodizing. The roughened support may be anodized using an acid, such as phosphoric acid, sulfuric acid, or a mixture of acids. The support should be of sufficient thickness to sustain the wear from printing and be thin enough to wrap around a cylinder in a printing press, typically about 100 μm to about 600 μm.

The substrate may comprise an interlayer, which is between the support and the imageable layer. The interlayer may be formed by treatment of the support with, for example, silicate, hexafluorosilicic acid, dextrine, phosphate/fluoride, polyvinyl phosphonic acid (PVPA), a vinyl phosphonic acid co-polymer, or a water-soluble diazo resin. The back side of the support (i.e., the side opposite the imageable layer) may be coated with an antistatic agent and/or a slipping layer or matte layer to improve handling and "feel" of the imageable element.

Imageable Layer

Compositions useful in the imageable layer of the imageable elements of the invention are disclosed in Patent Publication US 2003/0064318 A1, the disclosure of which is incorporated herein by reference. The imageable layer comprises a polymerizable compound and a polymeric binder. The polymeric binder is a polymer that comprises a polymer backbone and polyethylene oxide side chains. Other conventional ingredients of imageable layers, such as free radical generators, co-binders, surfactants, and dyes, may also be present.

The polymeric binder is a co-polymer that comprises K units and L units. The K unit is selected from —[$CH_2C(R^1)R^2$]—, —[$CH_2CR^1(CO_2R^3)$]—, —[$CH_2CR^1(CONR^3_2)$]—, —[$CH(CONR^6CO)CH$]—, and mixtures thereof. The L unit, which comprises the polyethylene oxide side chain, is —[$CH_2C(R^1)(CO_2(CH_2CH_2O)_nT)$]—.

Each $R^1$ is independently hydrogen, methyl, or a mixture thereof. $R^2$ is hydrogen, methyl, phenyl, substituted phenyl, halogen, cyano, alkoxy of one to four carbon atoms, acyl of one to five carbon atoms, acyloxy of one to five carbon atoms, allyl, or a mixture thereof. Substituted phenyl groups include, for example, 4-methylphenyl, 3-methylphenyl, 4-methoxyphenyl, 4-cyanophenyl, 4-chlorophenyl, 4-fluorophenyl, 4-acetoxyphenyl, and 3,5-dichlorophenyl. Halogen includes fluoro (F), chloro (Cl), and bromo (Br). Alkoxy groups of one to four carbon atoms include, for example, methoxy, ethoxy, n-propoxy, iso-propoxy, n-butoxy, and t-butoxy. Acyl of one to five carbon atoms include, for example, $H_3CO$— (acetyl), $CH_3CH_2CO$—, $CH_3(CH_2)_2CO$—, $CH_3(CH_2)_3CO$—, and $(CH_3)_3CCO$—. Acyloxy of one to five carbon atoms include, for example, $H_3CC(O)O$— (acetyloxy), $CH_3CH_2C(O)O$—, $CH_3(CH_2)_2C(O)O$—, $CH_3(CH_2)_3C(O)O$—, and $(CH_3)_3CC(O)O$—. $R^2$ is typically hydrogen, methyl, phenyl, cyano, or a mixture thereof.

$R^3$ is alkyl of one to six carbon atoms, phenyl, or a mixture thereof. Alkyl groups of one to six carbon atoms, include, for example, methyl, ethyl, n-propyl, iso-propyl, n-butyl, sec-butyl, iso-butyl, t-butyl, n-pentyl, iso-pentyl, neo-pentyl, n-hexyl, iso-hexyl, 1,1-dimethyl-butyl, 2,2-dimethyl-butyl, cyclopentyl, and cyclohexyl. Alkyl groups of one to eight carbon atoms additionally include, for example, n-hexyl, 2-ethylhexyl, 2,2,4-trimethylpentyl, and n-octyl. $R^3$ is typically methyl.

—[$CH(COR^6CO)CH$]— represents a cyclic imide structure. That is, the first and last carbon atoms are bonded by a carbon-carbon single bond. $R^6$ is hydrogen, hydroxyl, phenyl, substituted phenyl, alkyl of one to six carbon atoms, cyclohexyl, benzyl, or a mixture thereof. $R^6$ is typically phenyl, benzyl, or cyclohexyl.

n is about 5 to about 400, typically about 10 to about 100.

T is hydrogen, alkyl of one to eight carbon atoms, or phenyl. T is typically hydrogen, methyl, ethyl, n-butyl, or a mixture thereof.

The weight ratio of K units to L units is typically about 99:1 to about 45:55. The weight average molecular weight of the polymeric binder is typically about 3,000 to about 1,000,000; more typically 5,000 to 500,000; even more typically 10,000 to 100,000. The K and the L units together typically comprise about 100 wt %, more typically 100 wt %, of the polymeric binder. Small amounts of units derived from other monomers may be present, but are not necessary.

The polymeric binders may be prepared by free radical polymerization. In a typical preparation, a mixture of two monomers, one that is the precursor of the K unit and one that is the precursor of the L unit are co-polymerized. Free radical polymerization is well known to those skilled in the art and is described, for example, in Chapters 20 and 21, of *Macromolecules*, Vol. 2, 2nd Ed., H. G. Elias, Plenum, New York, 1984. Useful free radical initiators are peroxides such as benzoyl peroxide, hydroperoxides such as cumyl hydroperoxide and azo compounds such as 2,2'-azobis(isobutyronitrile) (AIBN). Chain transfer agents, such as dodecyl mercaptan, may be used to control the molecular weight of the compound. Suitable solvents for free radical polymerization include liquids that are inert to the reactants and which will not otherwise adversely affect the reaction, for example, water; esters such as ethyl acetate and butyl acetate; ketones such as methyl ethyl ketone, methyl isobutyl ketone, methyl propyl ketone, and acetone; alcohols such as methanol, ethanol, isopropyl, n-propanol, 1-methoxyethanol (Methyl CELLOSOLVE®), n-butanol; ethers such as dioxane and tetrahydrofuran; and mixtures thereof.

Precursors of the K unit include, for example, styrene; substituted styrenes, such as 3-methyl styrene, 4-methyl styrene, 4-methoxy styrene, 4-acetoxy styrene, and alpha-methyl styrene; acrylate and methacrylate esters, such as methyl acrylate, ethyl acrylate, butyl acrylate, n-hexyl acrylate, methyl methacrylate, ethyl methacrylate, n-propyl methacrylate, n-butyl methacrylate, n-pentyl methacrylate, neo-pentyl methacrylate, cyclohexyl methacrylate, n-hexyl methacrylate, 2-ethoxyethyl methacrylate, allyl methacrylate, and 2-(methylsulfonyl)ethyl methacrylate; cyanoacrylate esters, such as methyl cyanoacrylate and ethyl cyanoacrylate; vinyl esters, such as vinyl acetate and vinyl butyrate; vinyl ketones, such as methyl vinyl ketone and butyl vinyl ketone; acrylonitrile; methacrylonitrile; vinyl chloride; vinyl bromide; maleimides, such as maleimide, N-phenyl maleimide, N-cyclohexyl maleimide, N-benzyl maleimide, and N-hydroxy maleimide; acrylamides; such as acrylamide, methacrylamide, N,N-dimethyl acrylamide, and N,N-dimethyl methacrylamide; and mixtures thereof. Preferred precursors for the K unit include styrene, methyl methacrylate, acrylonitrile, N-phenyl maleimide, and methacrylamide.

Precursors of the L unit include, for example, polyethylene glycol monomethacrylate, polyethylene glycol methyl ether methacrylate polyethylene glycol ethyl ether methacrylate, polyethylene glycol butyl ether methacrylate, polyethylene glycol methyl ether acrylate, polyethylene glycol ethyl ether acrylate, polyethylene glycol phenyl ether acrylate, and mixtures thereof. Preferred precursors for the L unit include poly(ethylene glycol) methacrylate, poly(ethylene glycol) methyl ether methacrylate poly(ethylene glycol) acrylate, and poly(ethylene glycol) methyl ether acrylate. Polyethylene glycol methyl ether methacrylate can be prepared, for example, by the reaction of methacryloyl chloride with polyethylene glycol monomethyl ether in the presence of a tertiary amine, as described in Example 1 of US 2003/0064318 A1.

The imageable layer comprises a polymerizable compound. Polymerizable compounds and polymerizable compositions that contain polymerizable compounds are well known and are described, for example, in *Photoreactive Polymers: The Science and Technology of Resists*, A. Reiser, Wiley, New York, 1989, pp. 102–177; in "Photopolymers: Radiation Curable Imaging Systems," by B. M. Monroe, in *Radiation Curing: Science and Technology*, S. P. Pappas, Ed., Plenum, New York, 1992, pp. 399–440; and "Polymer Imaging" by A. B. Cohen and P. Walker, in *Imaging Processes and Material*, J. M. Sturge, et al., Eds, Van Nostrand Reinhold, New York, 1989, pp. 226–262. The compound may be polymerizable by dimerization, ring-opening polymerization, and/or addition polymerization.

Dimerizable systems comprise a binder that forms a crosslink on imaging. Crosslinkble binders include, for example, dimethylmaleimides, chalcones, cinnamates, and the polyvinyl alcohols functionalized with N-alkyl styrylpyridinium or N-alkyl styrylquinolinium groups, such as are described in, for example, Ichimura, U.S. Pat. Nos. 4,272,620; 4,287,335; 4,339,524; 4,564,580; and 4,777,114. Epoxides are well known ring-opening polymerizable compounds.

Addition polymerizable ethylenically compounds may be polymerizable by free radical polymerization and/or cationic polymerization. Cationic addition polymerizable ethylenically unsaturated compounds include vinyl ethers and vinyl aromatic compounds, such as styrene and alkoxy styrene derivatives.

Free radical polymerizable compositions comprise a free radical generator, that is a compound or combination of compounds that generates free radicals when the imageable element is imaged. Free radical generators are disclosed in, for example, "Photoinitiators for Free-Radical-Initiated Photoimaging Systems," by B. M. Monroe and G. C. Weed, *Chem. Rev.*, 93, 435–448 (1993) and in "Free Radical Polymerization" by K. K. Dietliker, in *Chemistry and Technology of UV and EB Formulation for Coatings, Inks, and Paints*, P. K. T. Oldring, ed, SITA Technology Ltd., London, 1991, Vol. 3, pp. 59–525. Typical free radical photoinitiating compounds include benzophenone; 2-hydroxy-2-methyl-1-phenylpropan-1-one; 2,4,6-trimethylbenzolyl-diphenylphosphine oxide; 2,2-dimethoxy-2-phenyl-acetophenone (benzildimethyl ketal, BDK); 2-methyl-1-[4-(methylthio) phenyl]-2-morpholinopropanone-1; 1-hydroxycyclohexylphenyl ketone; bis(2,6-dimethoxybenzolyl)-2,4,4-trim-ethyl-pentylphosphine oxide; haloalkyl-substituted s-triazines, such as such as 2,4,6-tri(trichloromethyl)-s-triazine, 2-phenyl-4,6-bis-trichloromethyl)-s-triazine, 2-(4-methoxyphenyl)-4,6-bis(trichloromethyl)-s-triazine, 2-(4-chlorophenyl)-4,6-bis-(trichloromethyl)-s-triazine, and 2,4,6-tri-(tribromomethyl)-s-triazine, which are described, for example, in Smith, U.S. Pat. No. 3,779,778; the systems disclosed in West, U.S. Pat. Nos. 5,629,354, and 5,942,372; and combinations thereof. Thermally sensitive free radical generators include, for example, peroxides such as benzoyl peroxide; hydroperoxides such as cumyl hydroperoxide; azo compounds such as AIBN; 2,4,5-triarylimidazolyl dimers (HABIs) such as are disclosed in Dueber, U.S. Pat. No. 4,565,769; onium salts, for example, diazonium salts, iodonium salts, sulfonium salts, phosphonium salts, and pyridinium salts; and mixtures thereof, such diaryliodonium salts and a coinitiator having a carboxylic acid group bonded via a methylene group to a N, O or S group is directly attached to an aromatic ring, which are disclosed in Kawabata, U.S. Pat. No. 5,368,990. The use of sulfonium salts to initiate free radical polymerization is disclosed, for example, in E. Takahashi, et al., *J. Appl. Poly. Sci.*, 91, 589–597 (2004), and E. Takahashi, et al., *J. Poly. Sci., Part A: Polymer Chemistry*, 41, 3816–3827 (2003). Diaryliodonium salts and triarylsulfonium salts are preferred onium salts.

Free radical polymerizable compositions comprise at least one ethylenically unsaturated compound that undergoes free-radical initiated addition polymerization, generally known as a monomer. The monomers are typically multifunctional, i.e., they comprise more than one ethylenically unsaturated, free radical polymerizable group. Typical multifunctional monomers are unsaturated esters of alcohols, preferably acrylate and methacrylate esters of polyols, such as ethylene glycol diacrylate and methacrylate, trimethylol propane tri- and tetraacrylate and methacrylate; the tri- and tetraacrylate and methacrylate esters of ethoxylated trimethylolpropane; diethylene glycol diacrylate and dimethacrylate; triethylene glycol diacrylate and dimethacrylate; 1,4-butanediol diacrylate and dimethacrylate; 2,2,4-trimethyl-1,3-pentanediol diacrylate and dimethacrylate; 1,8-octanediol diacrylate and dimethacrylate; 1,10-decanediol diacrylate and dimethacrylate; polyethylene glycol diacrylate and dimethacrylate; glycerol triacrylate and trimethacrylate; ethylene glycol dimethacrylate; di(trimethylolpropane) tetraacrylate; di(trimethylolpropane) tetramethacrylate; pentaerythritol tri- and tetraacrylate and methacrylate; dipentaerythriol penta- and hexaacrylate and methacrylate; tripropylene glycol diacrylate and dimethacrylate; the di-(2-acryloxyethyl)ether and the di-(2-methacryloxyethyl)ether of bisphenol A; ethoxylated bisphenol A diacrylate and dimethacrylate; 1,6-hexanediol diacrylate and dimethacrylate; neo-pentyl glycol diacrylate and dimethacrylate, etc. Oligomers and/or prepolymers, such as urethane acrylates and methacrylates, for example, the urethane acrylate obtained by reaction of DESMO-DUR® N100 and hydroxyethyl acrylate and pentaerythrol triacrylate; epoxide acrylates and methacrylates; polyester acrylates and methacrylates; polyether acrylates and methacrylates; and unsaturated polyester resins, may also be used. Numerous other unsaturated monomers polymerizable by free-radical initiated polymerization and useful in polymerizable compositions are known to those skilled in the art.

The polymerizable compound is present in sufficient amount to render the composition insoluble in an aqueous developer or in a fountain solution after imaging. The weight ratio of polymerizable compound to polymeric binder ranges from about 5:95 to about 95:5, preferably from about 10:90 to about 90:10, more preferably from about 20:80 to about 80:20, most preferably from about 30:70 to about 70:30.

The imageable layer may comprise one or more co-binders in addition to the binder. The co-binder may be a water-soluble or water-dispersible polymer, such as, a cellulose derivative such as carboxymethyl cellulose, methyl cellulose, hydroxy propyl methyl cellulose, hydroxy propyl cellulose, hydroxy ethyl cellulose; polyvinyl alcohol; polyacrylic acid; polymethacrylic acid; polyvinyl pyrrolidone; polylactide; polyvinyl phosphonic acid; a synthetic co-polymer, such as a co-polymer of an alkoxy polyethylene glycol acrylate or methacrylate, for example methoxy polyethylene glycol acrylate or methacrylate, with a monomer such as methyl methacrylate, methyl acrylate, butyl methacrylate, butyl acrylate, or allyl methacrylate; or a mixture thereof.

Imageable elements that are to be imaged with infrared radiation typically comprise an infrared absorber, known as a photothermal conversion material. Photothermal conversion materials absorb radiation and convert it to heat. Although a photothermal conversion material is not necessary for imaging with a hot body, imageable elements that contain a photothermal conversion material may also be imaged with a hot body, such as a thermal head or an array of thermal heads. The photothermal conversion material may be any material that can absorb radiation and convert it to heat. Suitable materials include dyes and pigments. Suitable pigments include, for example, carbon black, Heliogen Green, Nigrosine Base, iron (III) oxide, manganese oxide, Prussian Blue, and Paris blue. Because of its low cost and wide absorption bands that allow it to be used with imaging devices having a wide range of peak emission wavelengths, one particularly useful pigment is carbon black. The size of the pigment particles should not be more than the thickness of the layer that contains the pigment. Preferably, the size of the particles will be half the thickness of the layer or less.

The photothermal conversion material may be a dye with the appropriate absorption spectrum and solubility. Dyes, especially dyes with a high extinction coefficient in the range of 750 nm to 1200 nm, are preferred. Examples of suitable dyes include dyes of the following classes: methine, polymethine, arylmethine, cyanine, hemicyanine, streptocyanine, squarylium, pyrylium, oxonol, naphtho-quinone, anthraquinone, porphyrin, azo, croconium, triarylamine, thiazolium, indolium, oxazolium, indocyanine, indotricarbocyanine, oxatricarbocyanine, phthalocyanine, thiocyanine, thiatricarbocyanine, merocyanine, cryptocyanine, naphthalocyanine, polyaniline, polypyrrole, polythiophene, chalcogenopyryloarylidene and bis(chalcogenopyrylo)polymethine, oxyindolizine, pyrazoline azo, and oxazine classes. Absorbing dyes are disclosed in numerous publications, for example, Nagasaka, EP 0,823,327; DeBoer, U.S. Pat. No. 4,973,572; Jandrue, U.S. Pat. No. 5,244,771; Patel, U.S. Pat. No. 5,208,135; and Chapman, U.S. Pat. No. 5,401,618. Other examples of useful absorbing dyes include: ADS-830A and ADS-1064 (American Dye Source, Montreal, Canada), EC2117 (FEW, Wolfen, Germany), Cyasorb IR 99 and Cyasorb IR 165 (Glendale Protective Technology), Epolite IV-62B and Epolite III-178 (Epoline), SpectralR 830A and SpectralR 840A (Spectra Colors), as well as IR Dye A and IR Dye B, whose structures are shown below.

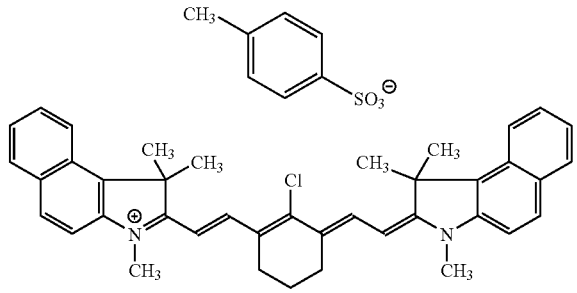

IR Dye A

For imageable elements that are to be developed in water or ink and/or fountain solution, water-soluble photothermal conversion materials are preferred. Water-soluble photothermal conversion materials include, for example, cyanine dyes which one or more sulfate and/or sulfonate groups. Other infrared absorbing cyanine anions that contain two to four sulfonate groups are disclosed, for example, in West, U.S. Pat. No. 5,107,063; Pearce, U.S. Pat. Nos. 5,972,838; Chapman, 6,187,502; Fabricius, U.S. Pat. No. 5,330,884; and Japanese Laid Open Application No. 63-033477. The preparation of cyanine dyes with polysulfonate anions is disclosed, for example, in U.S. patent application Ser. No. 10/722,257, filed Nov. 25, 2003, incorporated herein by reference. The preparation of N-alkyl sulfate cyanine compounds is disclosed, for example, in U.S. patent application Ser. No. 10/736,364, filed Dec. 15, 2003, incorporated herein by reference.

The amount of photothermal conversion present in the element is generally sufficient to provide an optical density of at least 0.05, and preferably, an optical density of from about 0.5 to at least about 2 to 3 at the imaging wavelength. As is well known to those skilled in the art, the amount of compound required to produce a particular optical density at a particular wavelength can be determined using Beer's law.

The free radical polymerizable composition typically comprises about 40 wt % to about 90 wt %, preferably about 50 wt % to about 85 wt %, of the infrared absorbing compound; 0 wt % to about 50 wt %, preferably about 1 wt % to about 30 wt %, of the co-binder; about 0.01 wt % to about 20 wt %, preferably about 0.1 wt % to about 10 wt %, of the free radical generator; about 0.1 wt % to about 50 wt %, preferably about 1 wt % to about 30 wt %, of the monomer; and about 0 wt % to about 20 wt %, preferably about 0 wt % to about 5 wt %, of the other ingredients.

Adhesion Promoting Ingredient

The imageable element comprises an adhesion promoting ingredient or a mixture of adhesion promoting ingredients. The adhesion promoting ingredient may be in a separate layer between the imageable layer and the substrate. Alternatively, or additionally, an adhesion promoting ingredient may be in the imageable layer.

The adhesion promoting ingredient may be a titanium chelate. TYZOR® titanium chelates are commercially available from E.I. du Pont de Nemours and Co., Wilmington, Del., USA.

Titanium chelates have the general structure:

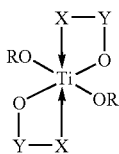

in which each R is a substituted or unsubstituted alkyl group, X is a functional group containing oxygen or nitrogen, and y is a two or three carbon chain. The R groups may be different. Typical R groups are methyl, ethyl, n-propyl, i-propyl, n-butyl, and i-butyl. Alternatively, one of both R groups may be bonded to the X or to the Y functional group. Typical titanium chelates include acetylacetone titanium chelates, ethyl acetoacetate titanium chelates, triethanol amine titanium chelates, and lactic acid titanium chelates.

Acetylacetone titanium chelate has the structure:

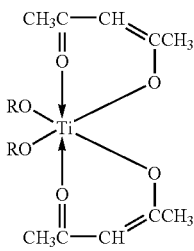

It is commercially available as TYZOR® AA titanium chelate.

Ethyl acetoacetate titanium chelate has the general structure:

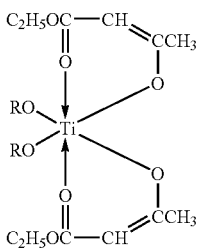

It is commercially available as TYZOR® DC titanium chelate.

Triethanol amine titanium chelates, such as titanium(triethanolamineaminato) iso-propoxide, in which R is propyl, are a mixture of chelates with at least one component having the structure:

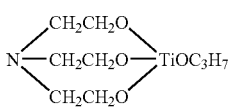

In this titanium chelate one R group of the titanium chelate general structure is n-propyl and the other R group of the titanium chelate general structure is a substituted ethyl group, which is bonded to the X, a nitrogen functional group. It is commercially available as TYZOR® TE titanium chelate.

Lactic acid titanium chelate has the structure:

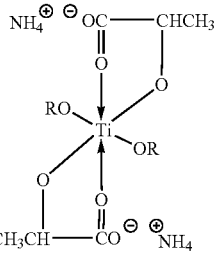

It is commercially available as TYZOR® LA titanium chelate.

A preferred titanium chelate is titanium(triethanolamineaminato) iso-propoxide.

The adhesion promoting ingredient may also be a co-polymer of a monomer having a polethylene oxide side chain with a monomer having an acidic group or an anhydride group that has been ring opened to form an acidic group or groups. The co-polymer comprises L units, which are defined above, and M units having the structure:

—[CH($R^4$)CH($CO_2$H)]— in which $R^4$ is hydrogen, methyl, —$CO_2$H, —$CO_2R^5$, or a mixture thereof, and $R^5$ is an alkyl group of one to six carbon atoms or a mixture of alkyl groups of one to six carbon atoms.

The co-polymers may be prepared by free radical polymerization, as described above. Precursors of the M units include, for example, acrylic acid, methacrylic acid, and maleic anhydride. If an anhydride is used, following polymerization the anhydride is opened to the diacid with water, to the half ester with an alcohol or mixture of alcohols, or to a mixture of the diacid and half ester with a mixture of water and alcohol or alcohols. Preferably, $R^4$ is hydrogen. The L units typically comprise about 5 wt % to about 70 wt %, more typically about 20 wt % to about 40 wt % of the co-polymers. The M units typically comprise about 95 wt % to about 30 wt %, more typically about 80 wt % to about 60 wt % of the co-polymer. Together, the L unites and M units typically make up about 100 wt %, more typically 100 wt %, of the co-polymer. Small amounts of units derived from other monomers may be present, but are not required.

The adhesion promoting ingredient may be in the imageable layer, or in may be in a separate layer between the imageable layer and the substrate, or in may be in both the imageable layer and the separate layer. The same adhesion promoting ingredient may be used in the imageable layer and in the separate layer, or different adhesion promoting ingredients may be used in the imageable layer and in the separate layer, or a mixture of the same or different adhesion promoting ingredients may be used in the imageable layer and/or the separate layer.

Addition of either a titanium chelate adhesion promoting ingredient or ingredients, or a co-polymer adhesion promoting ingredient or ingredients to the imageable layer increases the press run length without unacceptable release. Typically about 0.25 wt % to about 3.0 wt %, preferably about 0.5 wt % to about 1.5 wt %, more preferably about 1 wt % of the adhesion promoting ingredient or ingredients is added to the imageable layer, based on the dry weight of the imageable layer. Addition of both types of adhesion promoting ingredient to the imageable layer increases press run length without unacceptable release. Typically about 0.25 to about 3.0 wt %, preferably about 0.5 to about 1.5 wt %, more preferably about 1 wt % of each type of adhesion promoting ingredient is added to the imageable layer, based on the dry weight of the imageable layer.

A layer of the co-polymer adhesion promoting ingredient between the imageable layer and the substrate increases press run length without unacceptable release. Typical coating weights for the layer of adhesion promoting ingredient are about 21.5 mg/m$^2$ to about 108 mg/m$^2$. A layer of the co-polymer adhesion promoting ingredient or ingredients between the imageable layer and the substrate and/or addition of an adhesion promoting titanium chelate or chelates to the imageable layer also increases press run length without unacceptable release.

Preparation of the Imageable Element

The imageable element may be prepared by applying the imageable layer or, if present, the layer of adhesion promoting ingredient, over the substrate using conventional techniques. If a layer of adhesion promoting ingredient is present, the imageable layer is then applied over the layer of adhesion promoting ingredient.

The layers may be applied by any conventional method, such as coating or lamination. Typically the ingredients are dispersed or dissolved in a suitable coating solvent, such as water or a mixture of water and an organic solvent such as methanol, ethanol, 1-propanol, 2-propanol, and/or acetone, and the resulting mixture coated by conventional methods, such as spin coating, bar coating, gravure coating, die coating, slot coating, or roller coating. After coating, the resulting layer is dried to remove the coating solvent. The resulting element may be air dried at ambient temperature or at an elevated temperature, such as at about 65° C. for about 20 seconds in an oven. Alternatively, the resulting imageable element may be dried by blowing warm air over the element. The coating weight for the imageable layer is typically about 0.2 g/m$^2$ to about 5.0 g/m$^2$, preferably about 0.7 g/m$^2$ to about 2.5 g/m$^2$.

Imaging and Processing

The element may be thermally imaged with a laser or an array of lasers emitting modulated near infrared or infrared radiation in a wavelength region that is absorbed by the imageable element. Infrared radiation, especially infrared radiation in the range of about 800 nm to about 1200 nm, is typically used for imaging. Imaging is conveniently carried out with a laser emitting at about 830 nm, about 1056 nm, or about 1064 nm. Suitable commercially available imaging devices include image setters such as the CREO® Trendsetter (Creo, Burnaby, British Columbia, Canada), the Screen PlateRite model 4300, model 8600, and model 8800 (Screen, Rolling Meadows, Chicago, Ill., USA), and the Gerber Crescent 42T (Gerber).

Alternatively, the imageable element may be thermally imaged using a hot body, such as a conventional apparatus containing a thermal printing head. A suitable apparatus includes at least one thermal head but would usually include a thermal head array, such as a TDK Model No. LV5416 used in thermal fax machines and sublimation printers, the GS618-400 thermal plotter (Oyo Instruments, Houston, Tex., USA), or the Model VP-3500 thermal printer (Seikosha America, Mahwah, N.J., USA).

Imaging produces an imaged element, which comprises a latent image of imaged regions and complementary unimaged regions. After imaging, the unimaged regions are removed more rapidly by the developer than the imaged regions i.e., the element is negative working. Development of the imaged element to form a printing plate, or printing form, converts the latent image to an image by removing the unimaged regions, revealing the hydrophilic surface of the underlying substrate.

The imaged imageable element is mounted on a press and developed with ink and fountain solution during the initial prints. No separate development step is needed before mounting on press. This eliminates the separate development step along with both the processor and developer, thus simplifying the printing process and reducing the amount of expensive equipment required. The imaged imageable element is mounted on the plate cylinder of a lithographic press and developed by rotating the press cylinders and contacting the element with ink and fountain solution.

Numerous aqueous fountain solutions are known to those skilled in the art. Fountain solutions are disclosed, for example, in Matsumoto, U.S. Pat. No. 5,720,800; Archer, U.S. Pat. No. 5,523,194; Chase, U.S. Pat. No. 5,279,648; Bondurant, U.S. Pat. Nos. 5,268,025, 5,336,302, and 5,382,298; Egberg, U.S. Pat. No. 4,865,646; and Daugherty, U.S. Pat. No. 4,604,952. Typical ingredients of aqueous fountain solutions, in addition to water, typically deionized water, include pH buffering systems, such as phosphate and citrate buffers; desensitizing agents, such as dextrin, gum arabic, and sodium carboxymethylcellulose; surfactants and wetting agents, such as aryl and alkyl sulfonates, polyethylene oxides, polypropylene oxides, and polyethylene oxide derivatives of alcohols and phenols; humectants, such as glycerin and sorbitol; low boiling solvents such as ethanol and 2-propanol; sequestrants, such as borax, sodium hexametaphosphate, and salts of ethylenediamine tetraacetic acid; biocides, such as isothiazolinone derivatives; and antifoaming agents.

In conventional wet press lithographic printing, fountain solution and then ink are applied to the printing plate. For presses with integrated inking/dampening system, the ink and fountain solution are emulsified by various press rollers before being transferred to the plate as emulsion of ink and fountain solution. However, in this invention, the ink and fountain solution may be applied in any combination or sequence, as needed for the printing plate.

For on-press imaging, the imageable element is imaged while mounted on a lithographic printing press cylinder, and the imaged imageable element is developed on press with fountain solution during the initial press operation. This is especially suitable for computer-to-press application in which the imageable element (or elements, for multiple color presses) is directly imaged on the plate cylinder according to computer generated digital imaging information and, with minimum or no treatment, directly prints out regular printed sheets. On-press imaging may be carried out on, for example, a Heidelberg QUICKMASTER® DI 46-4 press (Heidelberger Druckmaschinen, Heidelberg, Germany).

INDUSTRIAL APPLICABILITY

The imageable elements of the invention can be used as radiation sensitive lithographic plate precursors. When the imageable element is used as a lithographic printing plate precursor, it can be developed on-press using fountain solution as the developer thus avoiding the costs associated with the use of alkaline developers. Once the imageable element has been imaged and developed to form a lithographic printing plate, printing can then be carried out by applying a fountain solution and then lithographic ink to the image on its surface. The fountain solution is taken up by the unimaged regions, i.e., the surface of the hydrophilic substrate revealed by the imaging and development process, and the ink is taken up by the imaged regions, i.e., the regions not removed by the development process. The ink is then transferred to a suitable receiving material (such as cloth, paper, metal, glass or plastic) either directly or indirectly using an offset printing blanket to provide a desired impression of the image thereon.

The advantageous properties of this invention can be observed by reference to the following examples, which illustrate but do not limit the invention.

EXAMPLES

| Glossary | |
|---|---|
| AIBN | Azobisisobutyronitrile (DuPont, Wilmington, Delaware, USA) |
| BYK 336 | Modified dimethyl polysiloxane co-polymer in a 25% xylene/methoxypropyl acetate solution (Byk Chemie, Wallingford, CT USA) |
| CREO ® Trendsetter 4300 | Commercially available platesetter, operating at a wavelength of 830 nm (Creo Products, Burnaby, BC, Canada) |
| Co-polymer 1 | Co-polymer of styrene and poly(ethylene glycol) methyl ether methacrylate (90:10) (See Example 1) |
| Co-polymer 2 | PEGMA/acrylic acid co-polymer (30:70) (See Example 2) |
| Co-polymer 4 | PEGMA/styrene/acrylonitrile co-polymer (30:70) (See Example 4) |
| ELVACITE ® 4026 | Polymethyl methacrylate (Lucite, Cordova, TN, USA) |
| IR Dye B | 1H-Benz(e)indolium, 2-(2-(3-((1,3-dihydro-1,1-dimethyl-3-(2-acetoxybutyl)-8-sulfonato-2H-benz(e)indol-2-ylidene)ethylidene)-2-(diphenylamino)-1-cyclopenten-1-yl)ethenyl)-1,1-dimethyl-3-(2-acetoxybutyl) 8-sulfonato-, sodium salt (see structure below) |
| IRGACURE ® 250 | Cationic iodonium photoinitiator (Ciba Specialty Chemicals, Tarrytown, NY USA) |
| KLUCEL ® 99 M | 2% Hydroxypropyl cellulose in water (Hercules, Wilmington, Delaware, USA) |
| Mercapto-3-traizole | Mercapto-3-triazole-1H,2,4 (PJS Chemicals, Tadcaster, and UK) |
| PEGMA | Polyethylene glycol methacrylate, MW 2,080, 50% solution in water (Aldrich, Milwaukee, WI, USA) |
| TYZOR ® TE | Titanium chelate; titanium(triethanolamineaminato) iso-propoxide (DuPont, Wilmington, Delaware, USA) |
| Urethane Acrylate | 80% 2-butanone solution of a urethane acrylate obtained by reaction of DESMODUR ® N100 and hydroxyethyl acrylate and pentaerythrol triacrylate |
| Sartomer SR355 | Di(trimethylolpropane) tetraacrylate (Sartomer, Exton, PA, USA) |
| Substrate A | Electrochemically grained, sulfuric acid anodized aluminum with no interlayer |
| Substrate B | Electrochemically grained, sulfuric acid anodized aluminum with polyvinylphosphonic acid interlayer |
| Substrate C | Electrochemically and mechanically grained, phosphoric acid anodized aluminum sub-coated with polyacrylic acid |
| Substrate D | Electrochemically and mechanically grained, phosphoric acid anodized aluminum with no sub-coat |

-continued

Glossary

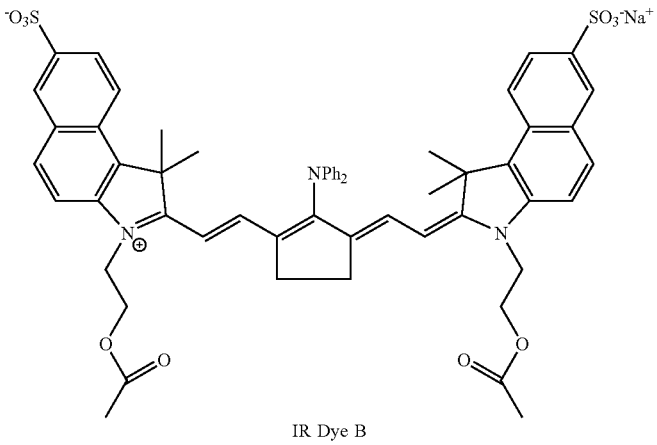

IR Dye B

Example 1

This examples illustrates the synthesis of Co-polymer 1, a polymeric binder of the invention. PEGMA (50% solution in water) (15 g), water (40.5 g), and 1-propanol (192 g) were charged into a 500 ml flask, equipped with condenser, mechanic stirring, temperature controller and nitrogen inlet. The mixture was heated to 80° C. under nitrogen. Styrene (66.9 g) and AIBN (0.48 g) were mixed and part of this solution (12 g) added to the reaction mixture, which became hazy in about 10 min. The rest of the AIBN solution was added over a 30 min. After 3 additional hours, the conversion to co-polymer was about 97%, based on the non-volatiles. The weight ratio of styrene to PEGMA in the co-polymer is about 90:10.

Example 2

This example illustrates the synthesis of a PEGMA/acrylic acid co-polymer, an adhesion promoting ingredient of the invention. PEGMA (50% solution in water) (42 g), 1-propanol (169.4 g), and deionized water (21.4 g), were charged into 500-ml flask and heated to 80° C. under a nitrogen atmosphere. Acrylic acid (49 g) and AIBN (0.49 g) were mixed in a beaker and part of this solution (8 g) was added. After 0.5 hr, the remaining solution was added over a period of 2 hr and the reaction mixture heated for a further 3 hr. Polymer conversion was 99% based on the % of non-volatiles. The final viscosity was B-C (G'H-'33), approximately 75 cps. The weight ratio of polyethylene glycol methacrylate to acrylic acid was 30:70

When the reaction was carried out in water using ammonium per sulfate as an initiator, either with or without dodecyl sulfate sodium salt, the reaction mixture became gummy. Therefore, a preferred solvent for this synthesis is a 80:20 by weight mixture of n-propanol/water.

Example 3

This Example illustrates an alternate procedure of the synthesis of a PEGMA/acrylic acid co-polymer, an adhesion promoting ingredient of the invention. PEGMA (42 g of a 50% solution in water), 1-propanol (169.4 g), and deionized water (21.4 g), acrylic acid (49 g), and AIBN (0.49 g) were charged into 500-ml flask and heated very slowly to 80° C. under a nitrogen atmosphere. The reaction mixture heated for a further 5 hr. Polymer conversion was 99% based on the % of non-volatiles. The final viscosity was N+ (G'H-'33), approximately 350 cps. The weight ratio of polyethylene glycol methacrylate to acrylic acid was 30:70

Example 4

This Example illustrates an alternate procedure of the synthesis of a PEGMA/styrene/acrylonitrile containing co-polymer, a polymeric binder of the invention. PEGMA (20 g of a 50% solution in water) dissolved in a mixture of 74.8 g of deionized water and 241.4 g of n-propanol was charged into a 1 L 4-neck flask and the reaction mixture was heated slowly to slight reflux (76° C.) under a nitrogen atmosphere. A pre-mixture of 20.0 g of styrene, 70 g of acrylonitrile and 0.7 gr of AIBN was added over a 2 hr period. After 6 hr another 0.5 g of AIBN was added. During processing, the reaction temperature was increased to 80° C. Then two additional 0.35 g portions of AIBN were added over the period of 6 hr. Heating was continued. After 19 hr, the conversion to co-polymer was >98% based on the percent non-volatiles. The weight ratio of PEGMA/styrene/acrylonitrile was 10:20:70 and the n-propanol/water ratio is 76:24. The residual acrylonitrile in solution was 0.5% based on determination by $^1$H-NMR.

General Procedures

This example illustrates the general procedure for the preparation and evaluation of imageable elements.

Preparation of the Imageable Elements

For all the examples except Examples 8A and 9A, a coating solution was prepared by dissolving the ingredients listed in Table 1 in a coating solvent containing 1-propanol (76 parts), methyl ethyl ketone (4 parts), and water (20 parts). For Examples 8A and 9A, the coating solution was prepared by dissolving the ingredients listed in Table 1A in the coating solvent. The resulting coating solutions typically contained about 5.5 wt % total solids.

TABLE 1

| Component | Parts by Weight (%) |
| --- | --- |
| Urethane Acrylate | 30.00 |
| Co-polymer 1 | 57.17 |
| KLUCEL ® 99 M | 1.00 |
| IRGACURE ® 250 | 4.78 |
| Mercapto-3-triazole | 2.78 |
| BYK 336 | 2.27 |
| IR Dye B | 2.00 |

TABLE 1A

| Component | Parts by Weight (%) |
| --- | --- |
| Urethane Acrylate | 30.00 |
| Co-polymer 4 | 46.25 |
| Sartomer SR355 | 4.90 |
| ELVACITE ® 4026 | 4.90 |
| KLUCEL ® 99 M | 1.00 |
| IRGACURE ® 250 | 4.69 |
| Mercapto-3-triazole | 2.73 |
| BYK 336 | 2.23 |
| IR Dye B | 1.96 |

Adhesion promoting ingredients were added at a level of 1 part by weight to the formulations above. The coating solutions were coated onto the indicated substrate with a Meyer bar coater, or a laboratory hopper coater. The dry coating weight of the imageable layer was typically about 1.5 g/m².

Evaluation Procedures

The imageable elements were evaluated by the following procedures.

Adhesion/Run Length Test

This test had two parts.

1. Screening

A precursor was imaged on the CREO® Trendsetter 4300 at imaging energies of 100 mJ/cm² and 200 mJ/cm². The imaged precursor was mounted directly on an A. B. Dick 9870 Duplicator Press (A. B. Dick, Niles, Ill., USA). The press was charged Van Son Rubber Base black Ink (Van Son Ink, Mineola, N.Y., USA). The aqueous fountain solution contained about 23.5 ml/L (3 oz per gallon) Varn Litho Etch142W (Varn International, Addison, Ill., USA), and about 23.5 ml/L (3 oz per gallon) Varn PAR (alcohol substitute) in water. For the AB Dick press the developing procedure is to wet a non-abrasive rag with fountain solution and apply solution to the plate with gentle rubbing. The press is then started and the damping system engaged to further wet the plate with fountain solution. After a few revolutions, the inking system is then engaged. Then 250 copies were printed. Image assessment based on condition of printed image after 250 impressions.

Adhesion of the photo-iamgeable layer to the substrate was rated as a value between 1 and 5, 5 being the best. A rating of 5 signified no deterioration of the image throughout the run, whereas a rating of 1 signified complete loss of image. The intermediate ratings signify proportionate improvements in the quality of the image at the end of the run.

2. Long Run

Imageable elements were imaged as above, but with an imaging energy of 300 mJ/cm² or higher. The imageable elements were developed and press tested on a Komori press Model no. S-26 with the same fountain solution as above. Run length is the number of impressions with acceptable print quality.

Developability

Developability was measured by inspection of the impressions produced by a print run (either short screening run or full length). The developability is rated as a value between 1 and 5, 5 being the best. A rating of 5 signifies complete development after 5 or less impressions. A rating of 1 signifies no or little development after 250 impressions (for a short run) or 1000 impressions for a long run. The intermediate ratings signify proportionate levels of developability. Ratings of 4 or 5 are highly desirable for the on-press development process.

Shelf life

Shelf life was measured by two different accelerated aging tests:

1) Storage for 3 days at about 49° C. (120° F.).

2) Storage 3 days at 40° C. and 80% relative humidity

After aging, the imageable elements were evaluated with the screening test described above and rated as a value between 1 and 5, 5 being the best. Generally, the failure mode of imageable elements with unsatisfactory shelf life is poor development. The typical mode of failure when plates were treated with heat or with both the heat and humidity regimes described above, was an increase in the number of impressions required to develop the plate. The level of aging can be thought of as the change of ranking of the development. However, typically the ranking of the fresh plates would be 5 so the aging rating used was the same as the rating for development on the heat-treated plates.

Comparative Examples 1–4

Imageable elements containing the imageable layer over the substrate were prepared and evaluated as described above.

TABLE 2

| Example | Substrate | Run length | Developability | Aging |
| --- | --- | --- | --- | --- |
| C1 | A | <B[a] | 3 | 3 |
| C2 | B | 4K | 5 | 3 |
| C3 | C | 25–30K | 5 | 5 |
| C4 | D | >B[a] | 5 | 2 |

[a]Not tested on a long run press. Relative value based on screening tests. B refers to Substrate B, evaluated in Example C2.

Examples 5–7

Following the General Procedures, the imageable elements shown in Table 3 were prepared and evaluated. In Example 5, a layer of Co-polymer 2 (75.3 mg/m²) was coated onto Substrate A by pumping a 0.5% aqueous solution through a slotted hopper that delivered a coating bead to the passing substrate mounted a 3.7 meter diameter drum heated to 66° C., resulting in a wet laydown of 21 cm³ of solution per m² of substrate surface. The layer of adhesion promoting material was dried for 1 min before the imageable layer was coated over it. In addition to Co-polymer 2, 0.11 wt % of BYK 336 was added to the coating solution.

In Example 6, a layer of Co-polymer 2 (7 mg/ft$^2$) was coated onto Substrate A and dried before the imageable layer was coated on the substrate. 1 wt % TYZOR® TE, based on the total solids in the imageable layer, was added to the coating solution for imageable layer. In Example 7, 1 wt % Co-polymer 2 and 1 wt % TYZOR® TE were added to the coating solution for imageable layer. For comparison, Comparative Example 1 (C1) is shown in Table 3.

TABLE 3

| Example | Substrate | Run length | Developability | Aging |
|---|---|---|---|---|
| C1 | A | <B$^a$ | 3 | 3 |
| 5 | A | >B$^a$ | 5 | 3 |
| 6 | A | 18–35K$^b$ | 5 | 4 |
| 7 | A | >B$^a$ | 5 | 5 |

$^a$Not tested on a long run press. Relative value based on screening tests. "B" refers to Substrate B, evaluated in Example C2.
$^b$Depending on imaging energy. Range from 300 to 500 mJ/cm$^2$. Substrates B and C imaged at 300 mJ/cm$^2$. 18K is the run length for 300 mJ/cm$^2$ and 35K is the run length of 500 mJ/cm$^2$.

Examples 8, 8A, 9, and 9A

Following the General Procedures, the imageable elements shown in Table 4 were prepared and evaluated. In Example 8, 1 wt % Co-polymer 2, based on the total solids in the imageable layer, was added to the coating solution for imageable layer. In Example 9, 1 wt % TYZOR® TE was added to the coating solution for imageable layer. For comparison, Comparative Example 1 (C2) is shown in Table 3.

TABLE 4

| Example | Substrate | Run length | Developability | Aging |
|---|---|---|---|---|
| C2 | B | 4K | 5 | 3 |
| 8 | B | 5K | 5 | 5 |
| 8A | B | 35K | 5 | 5 |
| 9 | B | 20K | 5 | 3 |
| 9A | B | 35K | 5 | 5 |

Examples 10–12

Following the General Procedures, the imageable elements shown in Table 5 were prepared and evaluated. In Example 10, a layer of Co-polymer 2 (75.3 mg/m$^2$) was coated onto Substrate D and dried before the imageable layer was coated on the substrate. In Example 11, 1 wt % Co-polymer 2, based on the total solids in the imagineable layer, was added to the coating solution for imageable layer. In Example 11, a layer of Co-polymer 2 (75.3 mg/m$^2$) was coated onto Substrate D and dried before the imageable layer was coated on the substrate and 1 wt % TYZOR® TE was added to the coating solution for imageable layer. For comparison, Comparative Example 4 (C3) is shown in Table 5.

TABLE 5

| Example | Substrate | Run length | Developability | Aging |
|---|---|---|---|---|
| C3 | C | 25–30K | 5 | 5 |
| 10 | C | 20K | 5 | 5 |
| 11 | C | 35–40K | 5 | 5 |
| 12 | C | 35–40K | 5 | 5 |

Having described the invention, we now claim the following and their equivalents.

What is claimed is:

1. An imageable element comprising:
   (a) a substrate comprising a support; and
   (b) an imageable layer over the substrate;
   in which:
   the support is aluminum or an aluminum alloy;
   the imageable layer comprises a polymerizable compound and a polymeric binder;
   the polymeric binder comprises K units and L units, and
   the imageable element comprises one or more adhesion promoting ingredients selected from the group consisting of:
   i) titanium chelates;
   ii) co-polymers that comprise L units and M units; and
   iii) mixtures thereof;
   the K units are selected from —[CH$_2$C(R$^1$)R$^2$]—, —[CH$_2$CR$^1$(CO$_2$R$^3$)]—, —[CH$_2$CR$^1$(CONR$^3$$_2$)]—, —[CH(CONR$^6$CO)CH]—, and mixtures thereof;
   the L units are —[CH$_2$C(R$^1$)(CO$_2$(CH$_2$CH$_2$O)$_n$T)]—;
   the M units are —[CH(R$^4$)CH(CO$_2$H)]—;
   each R$^1$ is independently hydrogen, methyl, or a mixture thereof;
   R$^2$ is hydrogen, methyl, phenyl, substituted phenyl, halogen, cyano, alkoxy of one to four carbon atoms, acyl of one to five carbon atoms, acyloxy of one to five carbon atoms, allyl, or a mixture thereof;
   R$^3$ is alkyl of one to six carbon atoms, phenyl, or a mixture thereof;
   R$^4$ is hydrogen, methyl, CO$_2$H, CO$_2$R$^5$, or a mixture thereof;
   R$^5$ is an alkyl group of one to six carbon atoms or a mixture of alkyl groups of one to six carbon atoms;
   R$^6$ is hydrogen, hydroxyl, phenyl, substituted phenyl, alkyl of one to six carbon atoms, cyclohexyl, benzyl, or a mixture thereof;
   n is about 5 to about 400; and
   T is hydrogen, alkyl of one to eight carbon atoms, phenyl, or a mixture thereof,
   provided that when said adhesion promoting ingredient includes a titanium chelate, it is present in said imageable layer only.

2. The imageable element of claim 1 in which the element further comprises an additional layer between the substrate and the imageable layer, and the additional layer comprises one or more adhesion promoting ingredients comprising only the copolymers that comprise L units and M units.

3. The imageable element of claim 1 in which the imageable layer comprises the one or more adhesion promoting ingredients.

4. The imageable element of claim 1 in which the one or more adhesion promoting ingredients comprises one or more of the titanium chelates in said imageable layer.

5. The imageable element of claim 4 in which the one or more adhesion promoting ingredients comprises titanium (triethanolamineaminato)iso-propoxide.

6. The imageable element of claim 1 in which the one or more adhesion promoting ingredients comprises one or more co-polymers selected from the co-polymers that comprises L units and M units.

7. The imageable element of claim 6 in which each of the one or more co-polymers comprises about 5 wt % to about 70 wt % of the L units and about 95 wt % to about 30 wt % of the M units, and the L units and the M units together comprise about 100 wt % of each of the one or more co-polymers.

8. The imageable element of claim 7 in which $R^3$ is methyl; T is hydrogen, methyl, ethyl, n-butyl, or a mixture thereof; and n is about 10 to about 100.

9. The imageable element of claim 8 in which each of the one or more co-polymers comprises about 20 wt % to about 40 wt % of the L units and about 80 wt % to about 60 wt % of the M units.

10. The imageable element of claim 1 in which the K units are selected from $-[CH_2C(R^1)R^2]-$, $-[CH_2CR^1(CO_2R^3)]-$, and mixtures thereof; $R^2$ is phenyl, cyano, or a mixture thereof; and $R^3$ is methyl.

11. The imageable element of claim 10 in which imageable layer comprises the adhesion promoting ingredient or mixture of adhesion promoting ingredients.

12. The imageable element of claim 11 in which the one or more adhesion promoting ingredients comprises one of more titanium chelates.

13. The imageable element of claim 12 in which the one or more adhesion promoting ingredients comprises titanium (triethanolamineaminato)iso-propoxide.

14. The imageable element of claim 11 in which the one or more adhesion promoting ingredients comprises one or more co-polymers selected from the co-polymers that comprises L units and M units.

15. The imageable element of claim 14 in which each of the one or more co-polymers comprises about 5 wt % to about 70 wt % of the L units and about 95 wt % to about 30 wt % of the M units, and the L units and the M units together comprise about 100 wt % of each of the one or more co-polymers.

16. The imageable element of claim 15 in which $R^3$ is methyl; T is hydrogen, methyl, ethyl, n-butyl, or a mixture thereof; and n is about 10 to about 100.

17. The imageable element of claim 16 in which each of the one or more co-polymers comprises about 20 wt % to about 40 wt % of the L units and about 80 wt % to about 60 wt % of the M units.

18. The imageable element of claim 10 in which the adhesion promoting ingredient or mixture of adhesion promoting ingredients is in a separate layer between the substrate and the imageable layer.

19. The imageable element of claim 18 in which the adhesion promoting ingredient or mixture of adhesion promoting ingredients comprises one or more co-polymers selected from the co-polymers that comprises L units and M units.

20. The imageable element of claim 19 in which each of the one or more co-polymers comprises about 5 wt % to about 70 wt % of the L units and about 95 wt % to about 30 wt % of the M units, and the L units and the M units together comprise about 100 wt % of each of the one or more co-polymers.

21. The imageable element of claim 20 in which $R^3$ is methyl; T is hydrogen, methyl, ethyl, n-butyl, or a mixture thereof; and n is about 10 to about 100.

22. The imageable element of claim 1 in which the substrate additionally comprises an interlayer.

23. A method for forming an image, the method comprising the steps of:
thermally imaging an imageable element comprising an imageable layer and forming an imaged imageable element comprising imaged and complementary unimaged regions in the imageable layer; and
developing the imaged imageable element with ink and fountain solution and removing the unimaged regions;
in which:
the imageable element comprises:
(a) a substrate comprising a support; and
(b) an imageable layer over the substrate;
in which:
the support is aluminum or an aluminum alloy;
the imageable layer comprises a polymerizable compound and a polymeric binder;
the polymeric binder comprises K units and L units, and
the imageable element comprises one or more adhesion promoting ingredients selected from the group consisting of:
i) titanium chelates;
ii) co-polymers that comprise L units and M units; and
iii) mixtures thereof;
the K units are selected from $-[CH_2C(R^1)R^2]-$, $-[CH_2CR^1(CO_2R^3)]-$, $-[CH_2CR^1(CONR^3{}_2)]-$, $-[CH(CONR^6CO)CH]-$, and mixtures thereof,
the L units are $-[CH_2C(R^1)(CO_2(CH_2CH_2O)_nT)]-$;
the M units are $-[CH(R^4)CH(CO_2H)]-$;
each $R^1$ is independently hydrogen, methyl, or a mixture thereof;
$R^2$ is hydrogen, methyl, phenyl, substituted phenyl, halogen, cyano, alkoxy of one to four carbon atoms, acyl of one to five carbon atoms, acyloxy of one to five carbon atoms, allyl, or a mixture thereof;
$R^3$ is alkyl of one to six carbon atoms, phenyl, or a mixture thereof;
$R^4$ is hydrogen, methyl, $-CO_2H$, $-CO2R^5$, or a mixture thereof;
$R^5$ is an alkyl group of one to six carbon atoms or a mixture of alkyl groups of one to six carbon atoms;
$R^6$ is hydrogen, hydroxyl, phenyl, substituted phenyl, alkyl of one to six carbon atoms, cyclohexyl, benzyl, or a mixture thereof;
n is about 5 to about 400; and
T is hydrogen, alkyl of one to eight carbon atoms, phenyl, or a mixture thereof,
provided that when said adhesion promoting ingredient includes a titanium chelate it is present in said imageable layer only.

24. The method of claim 23 in which the K units are selected from $-[CH_2C(R^1)R^2]-$, $-[CH_2CR^1(CO_2R^3)]-$, and mixtures thereof; $R^2$ is phenyl, cyano, or a mixture thereof; and $R^3$ is methyl.

25. The method of claim 24 in which the imageable layer comprises the adhesion promoting ingredient or mixture of adhesion promoting ingredients.

26. The method of claim 25 in which the one or more adhesion promoting ingredients are selected from the titanium chelates.

27. The method of claim 26 in which the adhesion promoting ingredient or mixture of adhesion promoting ingredients comprises titanium(triethanolamineaminato)iso-propoxide.

28. The method of claim 27 in which the one or more adhesion promoting ingredients comprises one or more co-polymers selected from the co-polymers that comprises L units and M units, the one or more co-polymer each comprise about 20 wt % to about 40 wt % of the L units and about 80 wt % to about 60 wt % of the M units, and the L units and M units together comprise about 100 wt % of each of the one or more co-polymers.

29. The method of claim 27 in which $R^3$ is methyl; T is hydrogen, methyl, ethyl, n-butyl, or a mixture thereof; and n is about 10 to about 100.

30. The method of claim 27 in which the adhesion promoting ingredient or mixture of adhesion promoting ingredients is in a separate layer between the substrate and the imageable layer.

31. The method of claim 29 in which the adhesion promoting ingredient or mixture of adhesion promoting ingredients are one or more co-polymers selected from the co-polymers that comprises L units and M units.

32. The method of claim 30 in which $R^3$ is methyl; T is hydrogen, methyl, ethyl, n-butyl, or a mixture thereof; and n is about 10 to about 100, each of the one or more co-polymers comprises about 20 wt % to about 40 wt % of the L units and about 80 wt % to about 60 wt % of the M units, and the L units and M units together comprise about 100 wt % of each of the one or more the co-polymers.

* * * * *